United States Patent
Kramer et al.

[19]

[11] Patent Number: 5,901,085
[45] Date of Patent: May 4, 1999

[54] PROGRAMMABLE REFERENCE VOLTAGE SOURCE, PARTICULARLY FOR ANALOG MEMORIES

[75] Inventors: Alan Kramer, Agrate Brianza; Roberto Canegallo, Tortona; Mauro Chinosi, Cologno Monzese; Giovanni Gozzini, Palazzolo Sull'oglio; Pier Luigi Rolandi, Volpedo; Marco Sabatini, Brescia, all of Italy

[73] Assignee: STMicroelectronics, S.r.l., Agrate Brianza (MI), Italy

[21] Appl. No.: 08/941,880

[22] Filed: Sep. 30, 1997

[30] Foreign Application Priority Data

Sep. 30, 1996 [EP] European Pat. Off. .............. 96830498

[51] Int. Cl.[6] .................................................. G11C 16/04
[52] U.S. Cl. ............................... 365/185.18; 365/185.08; 365/185.24
[58] Field of Search ........................ 365/185.01, 185.18, 365/185.23, 185.24; 324/158

[56] References Cited

U.S. PATENT DOCUMENTS

| | | | |
|---|---|---|---|
| 4,181,980 | 1/1980 | McCoy ...................................... | 365/45 |
| 4,627,027 | 12/1986 | Rai et al. ................................... | 365/45 |
| 5,039,941 | 8/1991 | Castro ....................................... | 324/158 |
| 5,126,967 | 6/1992 | Simko ....................................... | 365/45 |
| 5,289,401 | 2/1994 | Shima ....................................... | 365/45 |
| 5,495,453 | 2/1996 | Wociechowski et al. .......... | 365/185.23 |

FOREIGN PATENT DOCUMENTS

WO 93/11541  6/1993  WIPO .

OTHER PUBLICATIONS

R. M. Morton, "Analog Memory Array, " IBM Technical Disclosure Bulletin, vol. 21, No. 6,pp. 2349–2351, Nov. 1978.

O. Fujita et al., "Characteristics of Floating Gate Device As Analogue Memory For Neural Networks," Electronics Letters, vol. 27 No. 11, pp. 924–926, May 23, 1991.

*Primary Examiner*—David Nelms
*Assistant Examiner*—David Lam
*Attorney, Agent, or Firm*—David V. Carlson; Frederick M. Fliegel; Seed and Berry LLP

[57] ABSTRACT

A programmable reference voltage source includes a nonvolatile memory cell, the floating-gate region of which stores electric charges determining a memorized threshold value. The drain terminal of the cell is biased at a constant voltage, and the source terminal is coupled to a constant-current source and to the inverting input of an operational amplifier having the noninverting input coupled to a reference voltage and the output coupled to the gate terminal of the cell. By defining the threshold of the cell as the gate voltage (measured with respect to ground) capable of causing the cell to be flown by the current set by the current source, the output voltage of the operational amplifier equals the threshold and may be used as a programmable reference in analog memories.

21 Claims, 3 Drawing Sheets

PROGRAMMABLE REFERENCE VOLTAGE SOURCE, PARTICULARLY FOR ANALOG MEMORIES

TECHNICAL FIELD

The present invention relates to a programmable reference voltage source, particularly for analog memories.

BACKGROUND OF THE INVENTION

As is known, for performing complex processing functions, analog memories with cells capable of memorizing analog or digital multibit values are currently being studied, for which use is advantageously made of nonvolatile floating-gate cells, particularly flash-EEPROMs, in which the value to be memorized is related to the threshold voltage of the cell. To read the cells and/or perform calculating operations, a number of voltage references are required; the references must be programmable to achieve a high degree of flexibility as regards use of the memories, to enable uniform design of memories to be used for various applications and in particular for various analog values to be stored, and to enable the reference voltages to be modified even during operation of the memory, according to the functions to be performed.

According to one known solution described in U.S. Pat. No. 5,126,967, the reference (and data) cells are read via a sample-and-hold circuit. This solution, however, fails to provide for fast read times when memorizing a large number of voltage levels.

SUMMARY OF THE INVENTION

In one embodiment, the present invention includes a circuit including a nonvolatile memory cell having a floating-gate region storing electric charges determining a threshold value memorized in the cell, a drain terminal, a gate terminal and a source terminal. A first constant-voltage line is connected to the drain terminal for biasing the drain terminal to a selected voltage. A constant-current source can be selectively coupled to the source terminal for determining a current flowing in the source terminal of the cell. A first operational amplifier having a first and a second input and an output is selectively coupled to the memory cell. The output can be selectively coupled to the gate terminal. The first input can be selectively coupled to the source terminal of the cell. The second input is coupled to a second constant-voltage line. The circuit additionally includes a buffer element coupled to the output of the first operational amplifier.

In another embodiment, the invention includes a method for providing a programmable voltage. The method includes coupling a drain terminal of a nonvolatile memory cell to a first constant-voltage line via a first state of a first switch, coupling a gate terminal of the nonvolatile memory to an output of a first operational amplifier via a first state of a second switch and coupling a source terminal of the nonvolatile memory cell to a constant-current source and a first input of the first operational amplifier via a first state of a third switch. A second constant-voltage signal is provided on a second input of the operational amplifier and the output signal from the first operational amplifier is output to a buffer element.

This embodiment may also include programming the memory cell by decoupling the drain terminal from the first constant-voltage line and coupling the drain terminal to a first programming line. The gate terminal is decoupled from the operational amplifier output and coupled to a second programming voltage line. This embodiment also optionally includes decoupling the source terminal from the constant-current source and coupling the source terminal to a reference potential line.

BRIEF DESCRIPTION OF THE DRAWINGS

A preferred, non-limiting embodiment of the present invention will be described by way of example with reference to the accompanying drawings, in which.

DETAILED DESCRIPTION OF THE DRAWINGS

Figure 1:
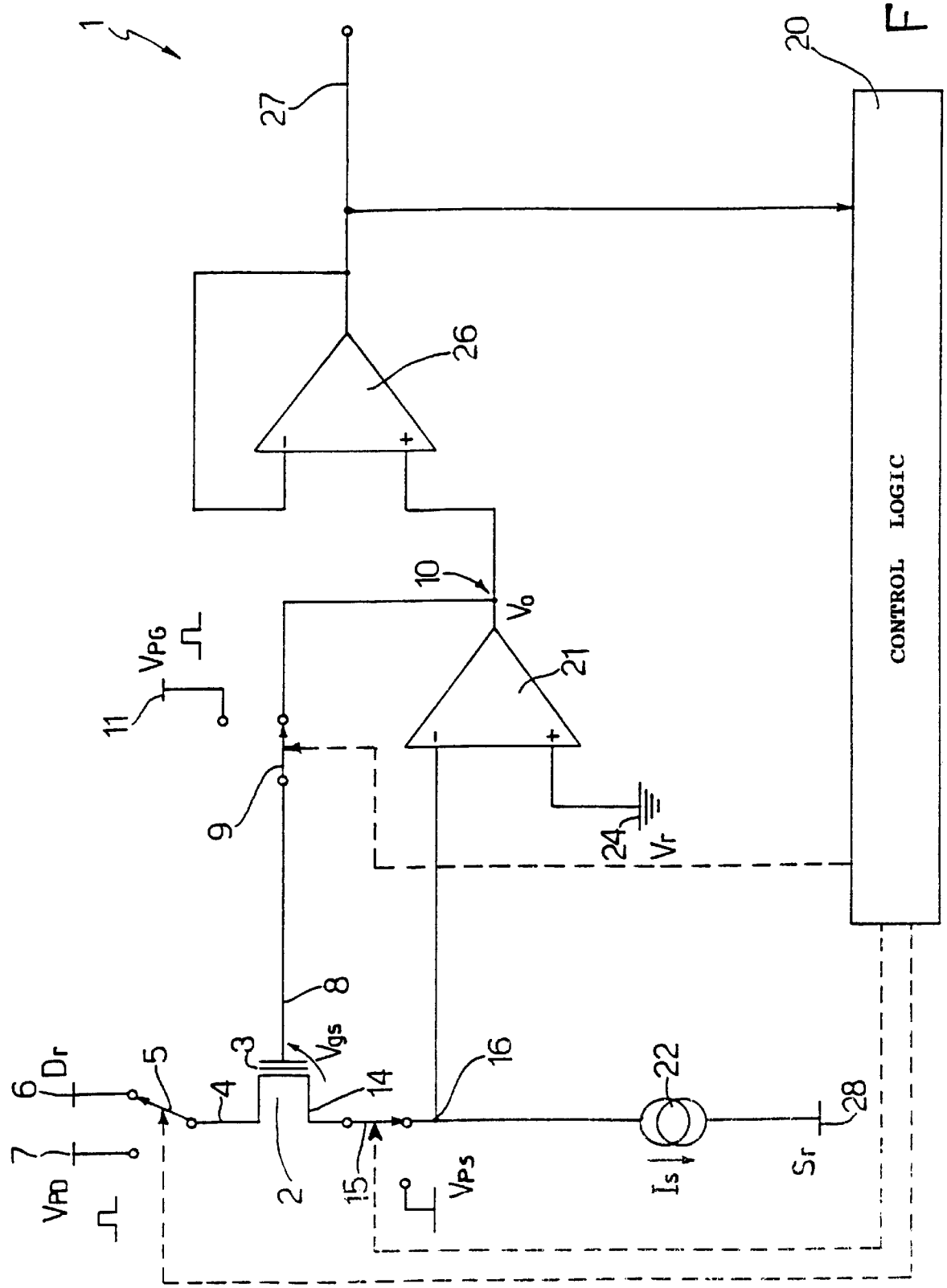
FIG. 1 is a simplified schematic diagram of the reference source according to the present invention.

Circuit 1, FIG. 1, includes a nonvolatile memory cell 2—more specifically, a flash cell—comprising a floating-gate region 3 (shown schematically) in which is stored an electric charge defining the threshold voltage $V_{th}$ of the cell 2; a drain terminal 4 coupled to a switch 5, which couples drain terminal 4, in a first position, to a reference potential line 6 at voltage $D_r$, and, in a second position, to a first programming line 7 at voltage $V_{PD}$; a gate terminal 8 coupled to a switch 9, which couples gate terminal 8, in a first position, to a node 10, and, in a second position, to a second programming line 11 at voltage $V_{PG}$; and a source terminal 14 coupled to a switch 15, which couples source terminal 14, in a first position, to a node 16, and, in a second position, to a voltage $V_{PS}$, which, in the case of programming, equals 0 V (ground line). The control terminals of switches 5, 9, 15 (shown only schematically in FIG. 1) are controlled by a control logic circuit 20.

Node 16 is coupled to the inverting input of a first operational amplifier 21, and to one terminal of a current source 22; first operational amplifier 21 has the noninverting input coupled to a reference line 24 at voltage $V_r$ (e.g., ground), and the output coupled to node 10 at voltage $V_o$. The output of first operational amplifier 21 is coupled to the noninverting input of a second full-feedback operational amplifier 26 (inverting input coupled to output 27) operating as a buffer. Current source 22—generating current $I_s$—has a second terminal coupled to a reference line 28 at voltage $S_r$, lower than voltage $V_r$. More specifically, if voltage $V_r$ is 0 V (ground line), voltage $S_r$ is negative, e.g., −250 mV.

Circuit 1 operates as follows. Switches 5, 9 and 15 are initially assumed to be in the positions shown, and the gate voltage (measured with respect to ground) able to cause the cell 2 to draw the current $I_s$ set by current source 22 is defined as the threshold $V_{TH}$ of cell 2.

The drain current $I_D$ through cell 2 is approximately given by the equation:

$$I_D = K(V_{gs} - V_{th})^2 \qquad (1)$$

where K is a constant depending on the fabrication method, $V_{gs}$ is the gate-source voltage drop, and $V_{th}$ is the threshold voltage at which cell 2 starts turning on (at theoretically zero current).

In the circuit shown, as current $I_D$ cell 2 must equal the current Is set by source 22 ($I_D=I_s$), and the overdrive voltage $V_{ov}=V_{gs}-V_{th}$ of the cell is then fixed. Moreover, when $V_r=0$ V and in equilibrium, voltage $V_s$ at source terminal 14 of cell 2, set by the closed-loop connection of operational amplifier 21, is also zero, so that the output voltage $V_o$ of first operational amplifier 21, which is equal to the gate voltage of cell 2 measured with respect to ground also equals the voltage drop $V_{gs}$ of cell 2, i.e., threshold voltage $V_{th}$ of cell 2, plus the overdrive voltage $V_{ov}$ determined in Equation (1). As such:

$$V_o = V_{ov} + V_{th}$$

so that, according to the above definition of threshold $V_{TH}$, it follows that $V_o = V_{TH}$.

Second operational amplifier 26 supplies voltage $V_o$ at output 27, and is capable of driving even high resistive/capacitive loads, so that output 27 presents an analog voltage of a value equal to the programmed threshold $V_{TH}$ of cell 2, which may be set and modified by altering the amount of charge stored in floating-gate region 3 of cell 2.

Programming of cell 2 is controlled by control logic circuit 20, which determines program pulse duration by controlling the position of switches 5, 9, 15, and decides when programming is to be interrupted. More specifically, to program cell 2, control logic circuit 20 couples its drain, gate and source terminals 4, 8 and 14 respectively to line 7, line 11 and $V_{PS}$ (ground) for a predetermined time interval; then switches switches 5, 9 and 15 to the positions shown in FIG. 1; reads the voltage $V_o$ reached by cell 2 at node 10 or output 27 (as shown in FIG. 1) and compares it with the desired programming value to determine whether the programming procedure is to be terminated or whether a further programming step is to be performed by again switching switches 5, 9, 15.

Figure 2:
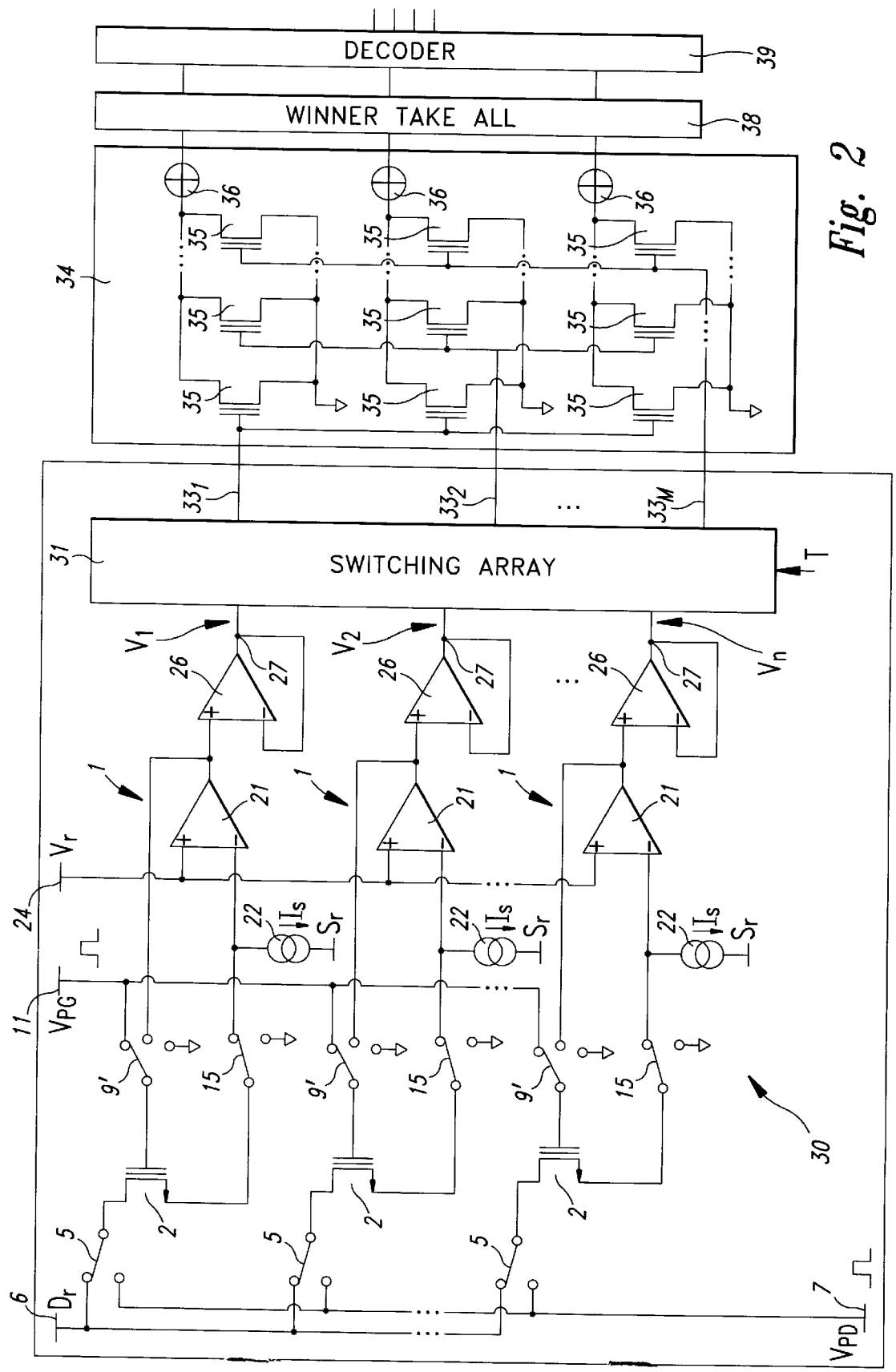
FIG. 2 shows one possible application, in an analog memory, of the source according to the invention.

An example of application of the source according to the invention in an analog memory for calculating the distance between vectors comprising a number of input values and vectors comprising a number of stored values is shown in FIG. 2, the general architecture of which is known from publications in the field (see, for example, "Ultra-Low-Power Analog Associative Memory Core Using Flash-EEPROM-Based Programmable Capacitors," by A. Kramer, R. Canegallo, M. Chinosi, D. Doise, G. Gozzini, P. L. Rolandi, M. Sabatini, P. Zabberoni, ISLPD '95 Symposium Proceedings, p. 203–208).

FIG. 2 shows a reference array 30 for calculating Euclidean distance. Reference array 30 comprises a number of circuits 1, each comprising a respective cell 2 memorizing a different threshold value, and each formed as shown in FIG. 1, except that, to prevent undesired soft writing phenomena, the switches (here indicated 9') coupled to the gate terminals of cells 2 have a third position for grounding the gate terminals of the cells not meant for programming (only one cell being programmed at a time).

The outputs of circuits 1—supplying voltages $V_1, V_2, \ldots, V_n$ equal to the different memorized thresholds $V_{TH}$—are supplied to any acceptable type of switching array 31, many being well-known in the art. One acceptable structure for the switching array is described in a co-pending patent application filed concurrently and entitled "Input structure, in particular for analog or digital associative memories"). The array 31, on the basis of a control signal T generated by control logic circuit 20 (not shown in FIG. 2), couples one or more nodes 27 to one or more word lines 33 of a memory array 34 comprising flash cells 35 of the same type as cells 2, and each memorizing a different threshold voltage.

More specifically, cells 35 are arranged in rows and columns; cells 35 in the same column have gate terminals coupled to the same word line 33, all the drain terminals in each row coupled together to an adding element 36, all the source terminals grounded together; and adding nodes 36 (of a type well known in the art so the details are not shown, for example by use of an operational amplifier fed back through a resistor) are coupled to a known "winner-take-all" circuit 38 in turn coupled at the output to a decoding circuit 39. Such winner-take-all circuits 38 and decoding circuit 39 may be selected from any acceptable such circuits, many being well known in the art.

The output voltages $V_1$–$V_N$ at nodes 27 are selectively supplied by switching array 31 to the M columns of gate terminals of cells 35 to determine the difference between the value of the vector supplied over word lines 33 and the vectors stored in cells 35. Nodes 36 add the currents flowing in all of cells 35 in the same row. "Winner-take-all" circuit 38 selects the row corresponding to the minimum value at adding nodes 36. Decoder 39 outputs the digital decoding of the selected row.

Figure 3:
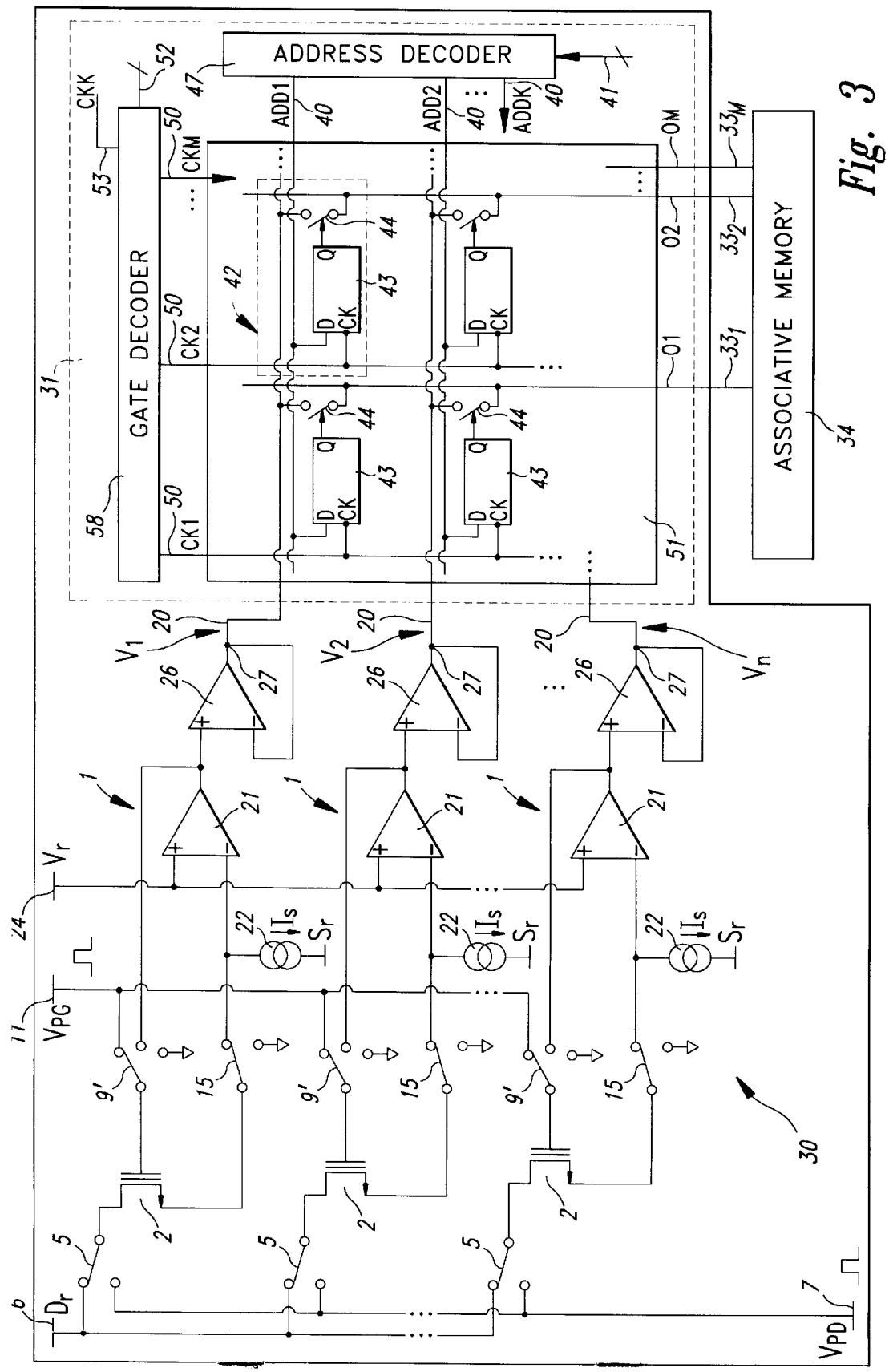
FIG. 3 is a simplified schematic diagram of the circuit of FIG. 2, showing the switching array in more detail.

FIG. 3 is a simplified schematic diagram of the circuit 30 of FIG. 2, showing one example of the switching array 31 in more detail. Structure 51 comprises a switching array 31 comprising N input lines 20, M output lines 33, a number of elementary cells 42 arranged in N rows and M columns, N address lines 40 and M enable lines 50. Input lines 20 and address lines 40 extend along the rows of matrix 51, output lines 33 and enable lines 50 extend along the columns of matrix 51, address lines 40 present signals ADD1, ADD2 . . . ADDN generated by an address decoder 47, enable lines 50 present enable signals CK1, CK2 . . . CKM generated by a gate decoder 58, the input lines present different analog input voltages V1, V2 . . . VN and the output lines 33 present different analog output voltages O1, O2 . . . OM.

Each elementary cell 42 comprises a latch 43 in the form of a D flip-flop and a switch 44. Each latch 43 has a data input D coupled to one of the address lines 40, an enable input CK coupled to one of enable lines 50 and an output Q. All the latches 43 of cells 42 in the same row are coupled to the same address line 40, all the latches 43 of cells 42 in the same column are coupled to the same enable line 50 and the output Q of each latch 43 is coupled to the control input of a respective switch 44.

Switches 44 (e.g., comprising CMOS devices for ensuring a high dynamic range) have a first terminal coupled to input lines 20 and a second terminal coupled to output lines 33. More specifically, the first terminals of switches 44 of cells 42 in the same row are coupled to the same input line 20 and the second terminals of switches 44 of cells 42 in the same column are coupled to the same output line 30.

As shown in FIG. 3, input lines 20 are each coupled to an output of the buffer amplifiers 26 and supply analog input voltages $V_1, V_2 \ldots$ VN. Output lines 33 may be coupled to an associative memory of any known type but are here shown to be coupled to a memory array 34 such as that of FIG. 2. The number N of input lines and the number M of output lines are chosen to meet the needs of specific applications. For example, N could be chosen to be equal to 32 and M could be chosen to be equal to 128.

Choosing N to be 32 allows circuit 30 of FIG. 3 to function, for example, as a digital-to-analog converter, when the input signals on nodes V1 to VN form, in one embodiment, equal-sized voltage steps over a predetermined range corresponding to 5 bits. The analog values thus generated may be addressed to any column in the memory array 34.

Address decoder 47 is formed in a known manner, and comprises an input 41 supplied with a digital value specifying which of the N address lines is to assume a predetermined logic state (e.g., "1"). Gate decoder 58 is also formed in a known manner, and comprises an input 52 supplied with a digital value specifying which of the M enable lines is to assume a predetermined logic state (e.g., "1") and an input 53 receiving clock pulses CKM.

In structure 51, when one of analog input voltages V1–VN is to be supplied to one or more of output lines 33, address decoder 47 is supplied with the digital address of the row of cells 42 coupled to the input line 20 of the required voltage, and switches the corresponding address signal to logic level "1". Gate decoder 58 is supplied with the digital address of the column/s of cells 42 coupled to the output line/s 30 to be supplied with the required voltage, and, on receiving clock pulse CKM, supplies a "1" to the corresponding enable line or lines 50. The latch or latches 43 receiving two "1" at inputs D and CK switch the corresponding output Q to "1", thus closing the corresponding switch 44 and coupling the input line 20 of the required voltage to the selected output line 30. As the coupling request is stored inside the selected latch 43, the coupling remains the same even after the termination of the enable pulse. Of course, the latch 43 can be reset, disabled or switched to a different voltage by address and gate decoders 47, 58 when desired.

The switching array 31 is thus capable of coupling one input line 20 to one or more of the output lines O1 . . . OM simultaneously. The switching array 31 may be reset in one clock operation by setting all of the address lines 40 to a logic "0" and then strobing all of the enable lines 50 simultaneously, with the result that all of the switches 44 are left open and all of the output lines O1 . . . OM are left floating. The input lines may be set to a predetermined reference or reset potential as another reset option. Opening switches or coupling output lines to a reset potential may be effected by addressing specific switches or by simultaneously strobing the entire array.

The advantages of the circuit described are as follows. In particular, it provides for analog references programmable according to a specific application by means of a simple, easy-to-integrate structure formed using the same technology as the analog circuits using the references. Programmability of the cell threshold voltage provides for freely and repeatedly modifying the output reference.

Moreover, if the output voltage is used as a reference for memory cells of the same type as the circuit cell, the voltage supplied is temperature-compensated. That is, any variation in threshold voltage $V_{th}$ of cell 2 due to temperature is supplied, via operational amplifiers 21, 26, to the memory cells to be read (35 in FIG. 2). As these, however, present the same variation in threshold voltage, the overdrive remains substantially constant. More specifically, if $V_t$ is the threshold voltage, and $V_i$ the gate-source voltage of the i-th cell 35, its overdrive voltage equals $V_{ov}=V_i-V_t$. If threshold $V_t$ of cells 35 increases by $\Delta V$ due to a variation in temperature ($V_t'=V_t+\Delta V$), threshold $V_{th}$ of cells 2 also increases by $\Delta V$. Since the overdrive voltage of cells 2 is fixed by current $I_s$, the output voltage to circuits 1, applied to the gate terminals of cells 35, increases by the same amount, i.e., $V_i'=V_i+\Delta V$, so that the overdrive voltage $V_{ov}'$ of cells 35 may be expressed as follows:

$$V_{ov}'=V_i'-V_t'=V_i+\Delta V-(V_t+\Delta V)=V_i-V_t=V_{ov}$$

The circuit described is highly precise, and, should precision be impaired by drift, may easily be reprogrammed to maintain predetermined levels of precision. Moreover, current consumption is low (in the order of $\mu A$) and the circuit may also be used in low-power (e.g., portable) electronic devices.

Cells 2 may be programmed and erased using the same configuration as in FIG. 1, by appropriately biasing the terminals.

Clearly, changes may be made to the circuit as described and illustrated herein without, however, departing from the scope of the present invention. In particular, the biasing value of the drain terminal of the cell may be selected as required, and the noninverting terminal of amplifier 21 may be biased at any constant voltage, while the ground connection preventing the body effect (which, as is known, causes the threshold value of the cell to depend also on the voltage between the source and body regions of the cell). Changes may be made to the programming procedure and programming circuit. The current source may be formed in any known manner (e.g., by means of MOS transistors or current mirrors), and the circuit may be used for any application requiring on-chip programmable voltage references. In the case of a reference array, and if only one reference voltage at a time is required, as opposed to forming a number of separate circuits 1, only cells 2 need be duplicated using a single operational amplifier 21 and respective buffer 26 with appropriate switching devices.

We claim:

1. A circuit comprising:
    a nonvolatile memory cell, said cell including a floating-gate region, a drain terminal, a gate terminal, and a source terminal, said floating-gate region storing electric charges determining a threshold value memorized in said cell;
    first and second biasing means for biasing said drain terminal and said source terminal of said cell;
    reading means for reading said threshold value, coupled to said gate and source terminals of said cell, said reading means including a first operational amplifier having a first and a second input and an output;
    said first biasing means including a first constant-voltage line;
    said second biasing means including a constant-current source determining a current flowing in said cell; and
    said first input of said first operational amplifier being coupled to a node in turn coupled to said source terminal of said cell, said second input of said operational amplifier being coupled to a second constant-voltage line, and said output of said operational amplifier being coupled to said gate terminal of said cell.

2. A source as claimed in claim 1 wherein said cell is a flash-EEPROM cell.

3. A source as claimed in claim 2 wherein said second terminal of said operational amplifier is grounded.

4. A source as claimed in claim 3 wherein said constant-current source has a first terminal coupled to said node, and a second terminal coupled to a third constant-voltage line set at a negative potential with respect to said second constant-voltage line.

5. A source as claimed in claim 4, further including a buffer element coupled to said output of said first operational amplifier.

6. A source as claimed in claim 5 wherein said buffer element comprises a second full-feedback operational amplifier.

7. A source as claimed in claim 6, further including:
    first switching means for selectively coupling said drain terminal to said first constant-voltage line and to a first programming voltage line;
    second switching means for selectively coupling said gate terminal to said output of said first operational amplifier and to a second programming voltage line;

third switching means for selectively coupling said source terminal to said node and to a reference potential line; and a control logic circuit generating control signals for said first, second and third switching means.

8. A circuit, comprising:

a nonvolatile memory cell including a floating-gate region storing electric charges determining a threshold value memorized in said cell, a drain terminal, a gate terminal and a source terminal;

a first constant-voltage line coupled to said drain terminal;

a constant-current source coupled to said source terminal of said cell;

a first operational amplifier having a first and a second input and an output, said output coupled to said gate terminal, said first input coupled to said source terminal of said cell, said second input coupled to a second constant-voltage line; and a buffer element coupled to said output of said first operational amplifier.

9. The circuit as claimed in claim 8 wherein said buffer element comprises a second operational amplifier.

10. The circuit as claimed in claim 8, comprising:

first switching means for selectively coupling said drain terminal to said first constant-voltage line or to a first programming voltage line;

second switching means for selectively coupling said gate terminal to said output of said first operational amplifier or to a second programming voltage line;

third switching means for selectively coupling said source terminal to said node or to a reference potential line; and a control logic circuit for generating control signals for said first, second and third switching means.

11. The circuit as claimed in claim 8 wherein said cell comprises a flash-EEPROM cell.

12. The circuit as claimed in claim 8 wherein said second terminal of said first operational amplifier is grounded.

13. The circuit as claimed in claim 8 wherein said constant-current source includes a first terminal coupled to said node, and a second terminal coupled to a third constant-voltage line set at a negative potential with respect to said second constant-voltage line.

14. The circuit as claimed in claim 8, comprising:

a first switch coupling said drain terminal to said first constant-voltage line in response to a first state of a control signal, and coupling said drain terminal to a first programming line in response to a second state of said control signal;

a second switch coupling said gate terminal to said output of said first operational amplifier in response to said first state of said control signal, and coupling said gate terminal to a second programming voltage line in response to said second state of said control signal;

a third switch coupling said source terminal to said node in response to said first state of said control signal, and coupling said source terminal to a reference potential line in response to said second state of said control signal; and a control logic circuit for generating said first and second states of said control signal.

15. A source as claimed in claim 14 wherein said buffer element comprises a second operational amplifier configured as a voltage follower.

16. A method comprising steps of:

coupling a drain terminal of a nonvolatile memory cell to a first constant-voltage line via a first state of a first switch;

coupling a gate terminal of said nonvolatile memory to an output of a first operational amplifier via a first state of a second switch;

coupling a source terminal of said nonvolatile memory cell to a constant-current source and a first input of said first operational amplifier via a first state of a third switch;

providing a second constant-voltage signal to a second input of said operational amplifier; and providing an output signal from said first operational amplifier to a buffer element.

17. A method as claimed in claim 16, further comprising steps of:

coupling said drain terminal to a first programming line via a second state of said first switch;

coupling said gate terminal to a second programming voltage line via a second state of said second switch; and coupling said source terminal to a reference potential line via a second state of said third switch.

18. A method as claimed in claim 17, further comprising a step of switching between said first and second states of said first, second and third switches in response to a control signal from a control logic circuit.

19. A method as claimed in claim 18 wherein said step of providing an output signal from said first operational amplifier to a buffer element comprises a step of providing an output signal from said first operational amplifier to a second operational amplifier configured as a voltage follower when said control logic circuit has switched said first, second and third switches to said first state.

20. A method as claimed in claim 19, further comprising steps of:

coupling an output of said voltage follower to a switching array;

setting said switching array to couple said output of said voltage follower to one row of an analog memory, said analog memory comprising memory cells configured in rows;

providing an output signal from each row of said analog memory to an input of a summing circuit;

providing output signals from each summing circuit to a winner take all circuit; and decoding which of said summing circuits provides least current to said winner take all circuit.

21. A method as claimed in claim 16, further comprising steps of:

coupling said drain terminal to a first programming line and decoupling said drain terminal from said first constant-voltage line via a second state of said first switch;

coupling said gate terminal to a second programming voltage line and decoupling said gate terminal from said output of said first operational amplifier via a second state of said second switch; and coupling said source terminal to a reference potential line and decoupling said source terminal from said constant-current source and said first input of said first operational amplifier via a second state of said third switch.

* * * * *